US011581879B2

United States Patent
(12) United States Patent
Matsko et al.

(10) Patent No.: US 11,581,879 B2
(45) Date of Patent: Feb. 14, 2023

(54) ARBITRARY MICROWAVE WAVEFORM GENERATOR USING LASERS IN CLOSE THERMAL AND MECHANICAL PROXIMITY

(71) Applicant: OEWAVES, INC., Pasadena, CA (US)

(72) Inventors: Andrey B Matsko, Pasadena, CA (US); Anatoliy A Savchenkov, Glendale, CA (US)

(73) Assignee: OEwaves, Inc., Pasadena, CA (US)

( * ) Notice: Subject to any disclaimer, the term of this patent is extended or adjusted under 35 U.S.C. 154(b) by 840 days.

(21) Appl. No.: 16/507,372

(22) Filed: Jul. 10, 2019

(65) Prior Publication Data

US 2020/0169249 A1 May 28, 2020

Related U.S. Application Data

(60) Provisional application No. 62/772,418, filed on Nov. 28, 2018.

(51) Int. Cl.

*H03K 3/42* (2006.01)
*H01S 5/10* (2021.01)
*H01S 5/024* (2006.01)
*H01S 5/065* (2006.01)
*G01S 7/03* (2006.01)

(Continued)

(52) U.S. Cl.

CPC ................ *H03K 3/42* (2013.01); *G01S 7/032* (2013.01); *H01S 5/02438* (2013.01); *H01S 5/02469* (2013.01); *H01S 5/0428* (2013.01); *H01S 5/0657* (2013.01); *H01S 5/10* (2013.01); *H01S 5/4006* (2013.01); *H01S 5/4012* (2013.01); *H03F 3/189* (2013.01)

(58) Field of Classification Search

CPC ...... H01S 5/4006; H01S 5/0428; H01S 5/065; H01S 5/142; H01S 5/02438; H01S 5/0657; H03K 3/42

See application file for complete search history.

(56) References Cited

U.S. PATENT DOCUMENTS 5,638,393 A * 6/1997 Kovacs .................... B41J 2/473 372/27
2002/0163942 A1* 11/2002 Baillargeon .......... H01S 3/1303 372/20

(Continued)

*Primary Examiner* — Tuan N Nguyen
(74) *Attorney, Agent, or Firm* — Loza & Loza, LLP; Daniel Mallery

(57) ABSTRACT

The disclosure relates in some aspects to providing miniature power-efficient agile photonic generators of microwave waveforms. Illustrative examples use chip lasers integrated in close thermal proximity with one another to provide a miniature microwave arbitrary waveform generator (AWG). Due to the small size of the lasers and the close integration, common ambient fluctuations from the environment or other sources can be efficiently reduced, yielding improved spectral purity of generated radio-frequency (RF) signals. Tight physical integration also permits a small device footprint with minimal acceleration sensitivity. The lasers may be locked to cavities or other resonators to allow efficient decoupling of the frequency and amplitude modulation of the lasers to provide flexibility to the waveform generator. Exemplary devices described herein can produce frequency chirped signals for radar applications. The frequency chirp may be linear and/or nonlinear. Tuning methods are also described herein.

19 Claims, 16 Drawing Sheets

(51) Int. Cl.

| | |
|---|---|
| ***H03F 3/189*** | (2006.01) |
| ***H01S 5/042*** | (2006.01) |
| ***H01S 5/40*** | (2006.01) |

(56) References Cited

U.S. PATENT DOCUMENTS

2003/0133485 A1* 7/2003 Liu ........................ H01S 5/026
372/102
2004/0240508 A1* 12/2004 Hu ........................ H01S 3/067
372/70
2005/0194519 A1* 9/2005 Wada ...................... H03K 3/42
250/214 R

* cited by examiner

Power vs. Frequency Curves

ARBITRARY MICROWAVE WAVEFORM GENERATOR USING LASERS IN CLOSE THERMAL AND MECHANICAL PROXIMITY

PRIORITY CLAIM AND CROSS-REFERENCE TO RELATED APPLICATION

This patent document claims the priority of U.S. Provisional Application No. 62/772,418, entitled "ARBITRARY MICROWAVE WAVEFORM GENERATOR BASED ON SELF-INJECTION LOCKED LASERS," filed on Nov. 28, 2018, the entire disclosure of which is incorporated by reference herein.

FIELD OF THE DISCLOSURE

Various aspects of the disclosure relate generally to microwave waveform generators. More specifically, aspects of the disclosure relate to methods and apparatus for generating arbitrary microwave waveforms using photonic components.

BACKGROUND

Current electromagnetic arbitrary waveform generation (AWG) is generally band-limited to the range below 2 GHz. High-frequency ultrabroad-bandwidth arbitrary waveforms (for example, 10-60 GHz) cannot be generated efficiently by conventional electronic means due to limits in digital-to-analog converter technology and high timing jitter. Microwave photonics may allow for increasing the range to 100 GHz. For example, arbitrary burst microwave waveforms can be generated using spectral shaping and frequency-time mapping of femtosecond laser pulses. Problems can arise, however, because microwave photonic devices often involve large components, such as the lasers and spectrum shapers, and hence the devices are often rather bulky and ill-suited for many applications.

Herein, methods and apparatus are provided to address these or other problems.

SUMMARY

In one aspect, an apparatus is disclosed that includes: first and second coherent light sources; and a resonator apparatus coupled to the first and second coherent light sources to provide first and second optical output beams corresponding, respectively, to the first and second coherent light sources, wherein the resonator apparatus is configured so that the first and second optical output beams are affected substantially equally by any ambient perturbations to the resonator apparatus (such as, for example, shared mechanical vibrations or common thermal variations). The first and second coherent light sources may be locked to modes of the resonator apparatus using, for example, optical, electronic, thermal or other types of a feedback configured to force frequencies of the coherent light sources to follow the modes of the resonator apparatus.

In another aspect, a method is disclosed that includes: generating first and second coherent light beams using first and second coherent light sources, respectively; and coupling the first and second coherent light beams into a resonator apparatus configured to output first and second optical output beams corresponding, respectively, to the first and second coherent light beams, the resonator apparatus configured so that the first and second optical output beams are affected substantially equally by any ambient perturbations to the resonator apparatus.

In yet another aspect, an apparatus is disclosed that includes: means for generating first and second coherent light beams; and means for coupling the first and second coherent light beams into a resonator apparatus configured to output first and second optical output beams corresponding, respectively, to the first and second coherent light beams, the resonator apparatus configured so that the first and second optical output beams are affected substantially equally by any ambient perturbations to the resonator apparatus.

DETAILED DESCRIPTION

Figure 1:
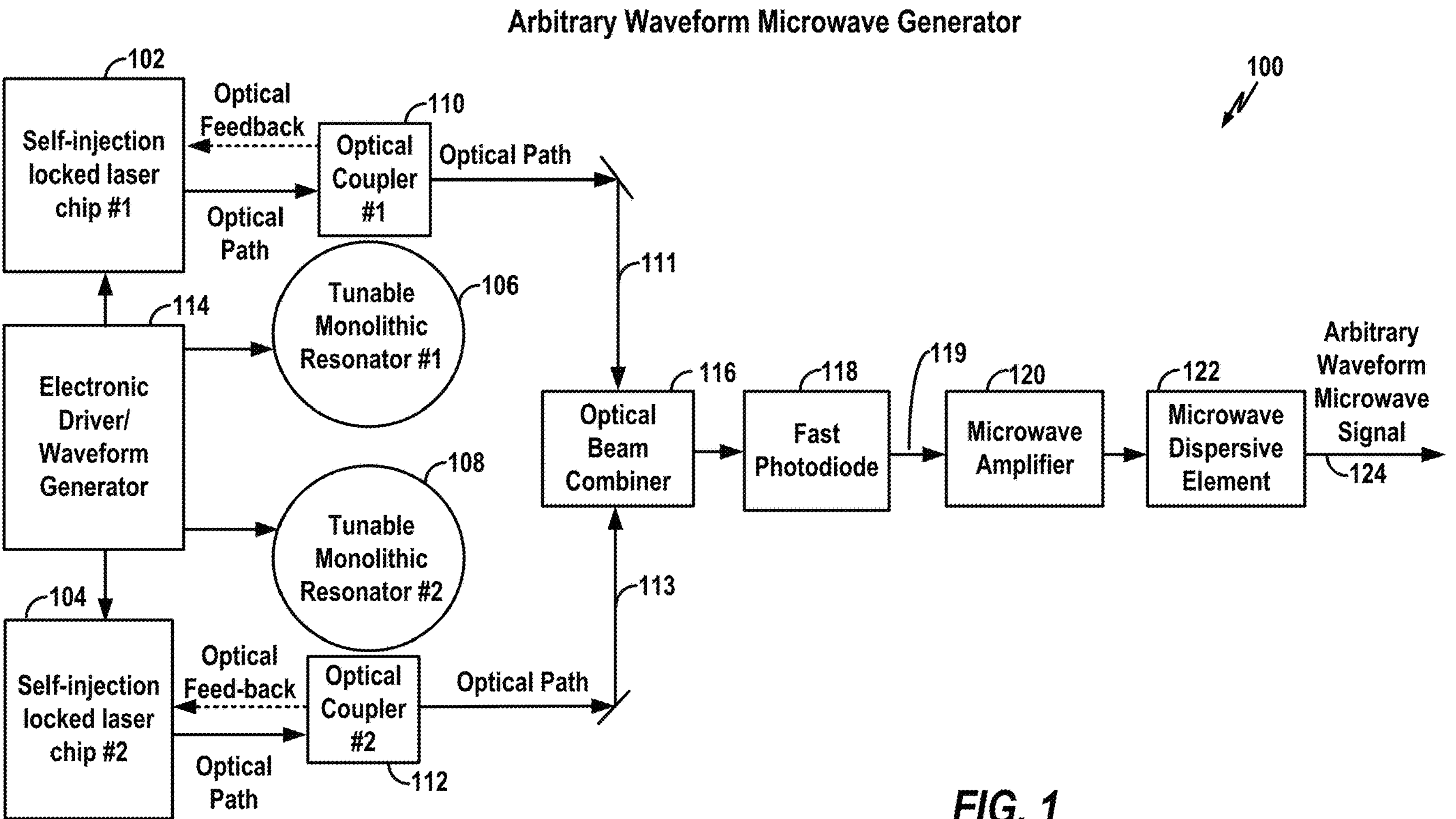
FIG. 1 illustrates a general schematic of an exemplary AWG apparatus having two agile independently-tunable monolithic optical microresonators mounted in thermal proximity and coupled to two lasers.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure. In the figures, elements may each have a same reference number or a different reference number to suggest that the elements represented could be different and/or similar. However, an element may be flexible enough to have different implementations and work with some or all of the systems shown or described herein. The various elements shown in the figures may be the same or different and, which one is referred to as a first element and which is called a second element is arbitrary.

Overview

Among other aspects, methods and apparatus are described herein for providing a miniature power efficient agile photonic generator of microwave waveforms. The methods and apparatus are capable of generating various microwave waveforms characterized, in some examples, with spectral width exceeding 4 GHz and repetition rate exceeding 1 MHz. That is, in at least some examples, ultrabroad bandwidth microwave pulses can be generated. In particular, exemplary devices described herein can produce frequency chirped signals useful for radar applications. The frequency chirp can be linear and/or nonlinear.

Ultrabroad bandwidth microwave pulses offer significant applications potential, such as (a) radar measurements and (b) data exchange with increased transmission rate and multipath tolerance in wireless communications. However, ultrabroad-bandwidth pulses may be difficult to generate with conventional chip-based electronics due to limitations in digital-to-analog (D/A) converter technology and high timing jitter.

An important aspect of the methods and apparatus disclosed herein lies in the selection of the lasers to use, as well the particular integration strategy described herein to generate arbitrary microwave waveforms. Generally speaking, microwave waveforms can be generated using mode locked lasers as well as tunable continuous wave lasers. Photonic arbitrary waveform generation (AWG) based on a mode-locked laser employs the spectral shaping of a supercontinuum source followed by a wavelength to time mapping, as well as other techniques involving polychromatic optical radiation (optical pulses). An arbitrary waveform generator may use an optics pulse shaper as the spectral shaping element, which typically requires accurate alignment and high environmental stability. AWG systems using mode-locked lasers can be rather bulky. By an "arbitrary waveform," it is meant that the waveform can be formed into substantially any chosen or selected waveform shape, such as a particular linear chirp waveform.

A photonics-based AWG based on a continuous wave (CW) laser may employ a laser beam consisting of two or more coherent longitudinal modes with frequency spacing equal to the wanted microwave frequency. As the longitudinal modes beat with each other in a photodiode, an electrical millimeter (mm)-wave signal can be generated. A change in the relative frequency of the lasers results in a change of the frequency of the microwave signal. A change in the power of the lasers results in a change in the power of the microwave signals. Such methods can have one or more disadvantages. Since the two longitudinal modes generated by a dual-mode laser (or two separate lasers) have low coherency, the mm-wave signal generated by their beating may have poor spectral purity. Stabilization of the lasers thus calls for bulky optical cavities. In addition, such lasers usually cannot be tuned fast enough for many applications.

Herein, methods and apparatus are provided that use miniature lasers integrated in proximity to each other to produce a miniature microwave arbitrary waveform generator. Due to the small size of miniature lasers and their tight integration, common perturbations or fluctuations coming from the environment and other sources (i.e. ambient perturbations or fluctuations) can be efficiently reduced leading to improved spectral purity of generated radio-frequency (RF) signals. Herein, perturbation refers to a deviation of an apparatus, device, signal, or process from its regular or normal state or path, caused by an outside influence. Herein, ambient refers to the surroundings of the apparatus, device, signal, or process. Examples of an ambient perturbation include, for example, a fluctuation in temperature of a photonic device caused by changes in the temperature of an apparatus in which the device is mounted, or a mechanical vibration of a photonic device caused by movement of the apparatus in which the device is mounted. The tight integration described herein can achieve a very small footprint for the device and a small acceleration sensitivity. Moreover, self-injection locking or other form of locking (e.g. electrical or thermal locking) may be used to lock frequencies of the two lasers to respective modes of the resonators to allow efficient decoupling of the frequency and amplitude modulation of the lasers that gives flexibility to the waveform generator. The AWG devices can use two lasers to generate both fixed frequency and tunable microwave signals. The spectral purity of the signals can be extremely high if the phase noise of the lasers is small. Generally speaking, the AWG device allows transfer of a base band arbitrary waveform to a microwave waveform or other RF waveform. (Herein, microwaves are considered to be a subset of RF signals, with RF signals generally in the range of $3\times10^5$ to $3\times10^{11}$ Hz and microwaves generally in the range of $3\times10^8$ to $3\times10^{11}$ Hz.) Herein, the term resonator includes resonating cavities. The terms optical cavity, optical resonating cavity and optical resonator may be used interchangeably. Generally speaking, an optical resonator is an arrangement of components configured to form one or more standing waves at certain resonance frequencies or wavelengths.

At least some prior devices generate microwaves using two modes of the same laser. The modes can have sufficient thermal and mechanical overlap to reduce common noise. However, the methods and apparatus described hereinbelow may allow for the frequency difference of the modes, as well as the emission power of the modes, to be tuned in a more agile way. (Herein, by "agile," it is meant that the apparatus can quickly shift its operating frequencies or other parameters and characteristics.)

Exemplary Apparatus

FIG. 1 illustrates a general schematic 100 of an exemplary AWG apparatus configured in accordance with one aspect of the present disclosure where optical self-injection locking is employed to lock a pair of lasers, respectively, to a pair of tunable resonators. It should be understood that locking of the light sources to the resonators need not be optical. The light sources may be locked to the resonators using any suitable method, including electronic and thermal methods using, for example, Pound-Drever-Hall techniques or side-lock techniques. Generally speaking, any suitable form of feedback may be employed (e.g., optical, electronic, thermal, etc.) so that the frequency of each laser follows or tracks (i.e. is "locked" to) a mode of a respective resonator. And so, for example, a first optical resonator or cavity may be coupled to a first coherent light source via optical, electronic, thermal or other type of feedback to force the first coherent light source to follow a respective mode of the first resonator or cavity. Likewise, a second optical resonator or cavity may be coupled to a second coherent light source via optical, electronic, thermal or other type of feedback to force the second coherent light source to follow a respective mode of the second resonator or cavity.

Laser chips #1 and #2 (labeled 102 and 104, respectively) in this particular example are self-injection locked to corresponding tunable monolithic optical resonators #1 and #2 (labeled 106 and 108, respectively) via corresponding optical couplers #1 and #2 (labeled 110 and 112, respectively). The optical paths may include various other optical components (not shown), such as lenses and delay lines. Self-injection locking is achieved via resonant optical feedback from the resonators to the lasers (as indicated by the dashed feedback paths). An electronic driver/waveform generator 114 is coupled independently to laser chips #1 and #2 and to the resonators #1 and #2 and tunes the frequency of the resonators #1 and #2 as well as the laser currents and/or laser temperatures to achieve a selected or desired amplitude and frequency change. The outputs 111 and 113 of the lasers #1 and #2 (via couplers #1 and #2) are combined by an optical beam combiner 116 and sent to a fast photodiode 118, which produces a microwave signal 119 as its output. The photodiode 118 operates as a detector to convert the modulation of the combined optical beam into a microwave signal (or other RF signal). Note that, in other examples, a beam combiner is not used. Rather, the two output beams (111, 113) are directly applied to the photodetector and beat on the photodetector to produce the microwave (or other RF signal). The microwave output of the photodiode 118 may be amplified and/or shaped via additional devices such as a microwave amplifier 120 and/or a microwave dispersive element 122 to provide an arbitrary microwave signal 124 as output from the AGM apparatus 100. In some illustrative examples, the laser chips #1 and #2 are semiconductor lasers, the resonators #1 and #2 are whispering gallery mode (WGM) microresonators, the optical couplers #1 and #2 are prisms or fiber optic couplers, and the dispersive element 122 is a pulse squeezer.

In FIG. 1, light passes through the combiner 116 and continues to the photodiode 118. Other configurations are possible. For example, the light from each laser #1 and #2 can be split at a X %/Y % beam splitter (not shown). X % of the light is sent to the fast photodiode 118 that generates the RF signal, and Y % of light is fed back to lock the lasers #1 and #2 to the modes of the microresonators #1 and #2. Input and output couplers also can be utilized. Notably, in illustrative examples, the resonators #1 and #2 are integrated on the same thermally-stabilized substrate for better thermal contact and the resonators #1 and #2 are made out of a material enabling agile frequency tuning of their spectra, such as stoichiometric lithium tantalate. As noted, although optical self-injection locking is shown in FIG. 1, other types of locking may be used.

Figure 2:
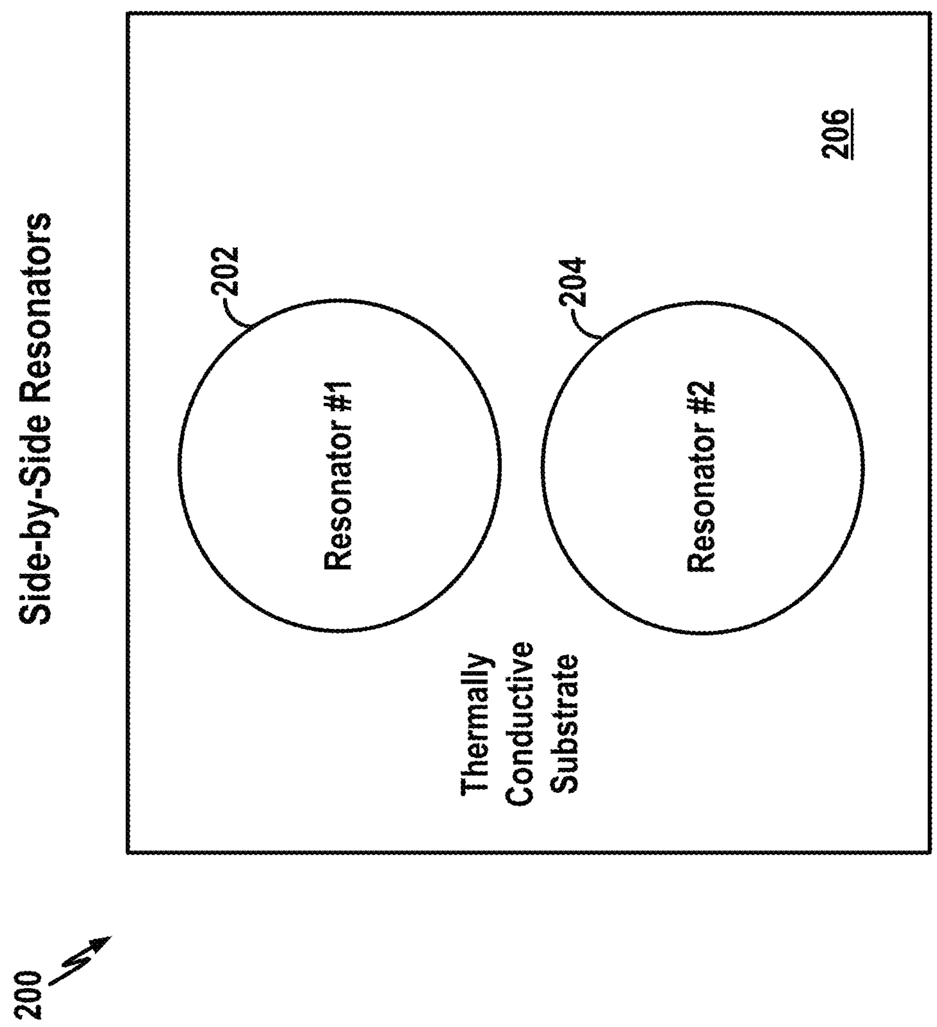
FIG. 2 illustrates exemplary side-by-side resonator placement.

FIG. 2 illustrates exemplary the side-by-side placement of resonators via a schematic 200. Resonators #1 and #2 (labeled 202 and 204, respectively) are mounted closely (or tightly) in a side-by-side configuration on a single monolithic thermally-conductive substrate 206. Other components, such as electrodes for applying electrical signals to control the resonators, mechanical transducers for applying mechanical control signals to control the resonators, and/or optical couplers for feeding light into and out of the resonators, may be provided but are not explicitly shown in FIG. 2. The apparatus of FIG. 2 may be regarded as a composite resonator.

Figures 3A, 3B:
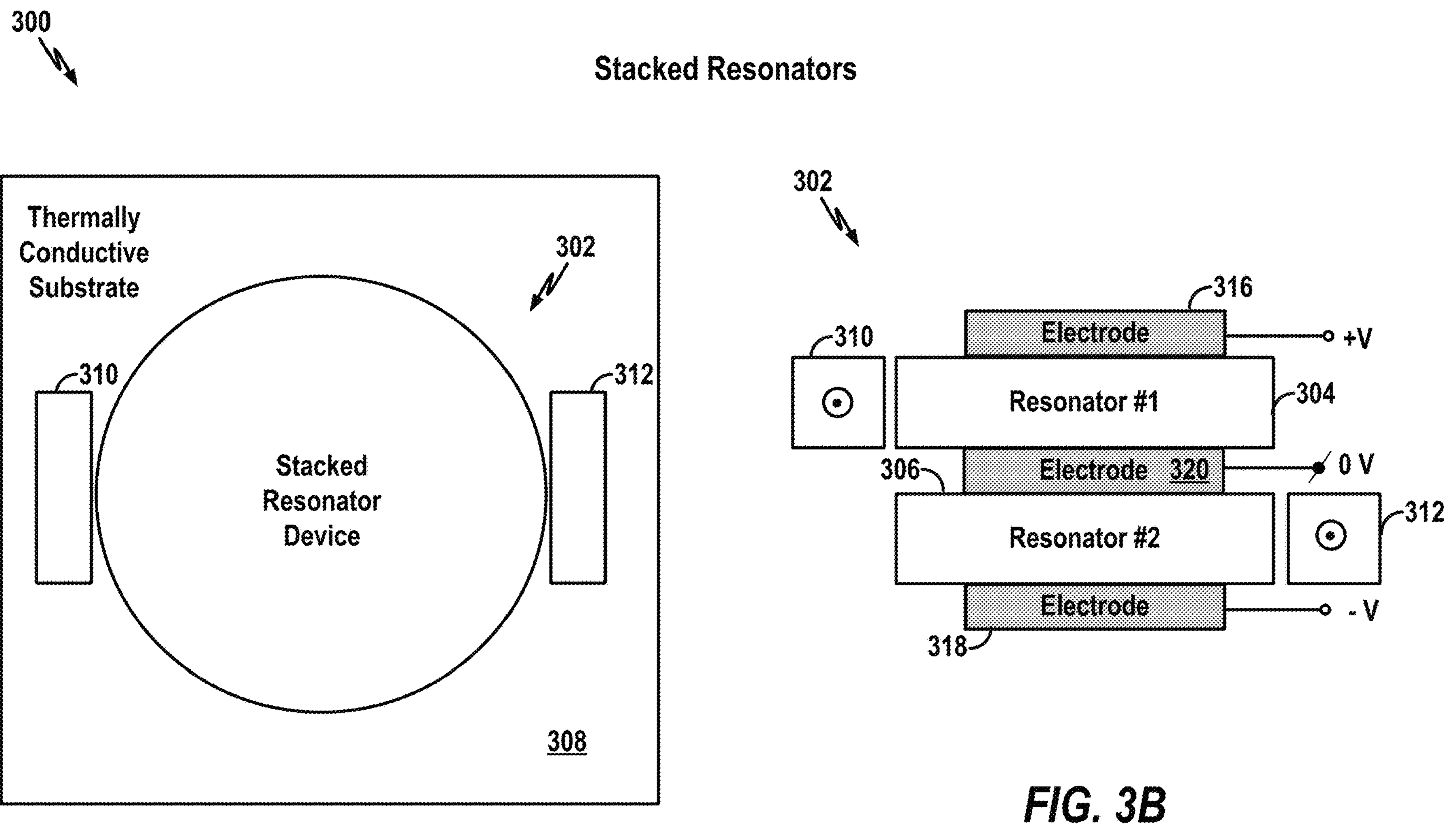
FIGS. 3A and 3B illustrate exemplary stacked resonator placement.

FIGS. 3A and 3B illustrate an exemplary stacked resonator configuration via schematic 300. Resonators #1 and #2 (labeled 304 and 306, respectively) are part of a stacked resonator apparatus or device 302, which is formed from the pair of resonators that are positioned or mounted one atop the other on a single monolithic thermally-conductive substrate 308. In the top view of FIG. 3A, the resonator device 302 is generally shown. In the side view of FIG. 3B, the individual resonators (Resonator #1 and Resonator #2) are illustrated. Optical couplers 310 and 312 for feeding light into and out of the resonators are shown in both FIGS. 3A and 3B. Electrodes 316, 318, and 320 for applying electrical signals to control the resonators are shown in FIG. 3B. Additionally or alternatively, other control components, such as mechanical transducers for applying mechanical control signals (e.g. stress or strain) to control the resonators or thermal transducers for applying thermal control signals (e.g. heat) to control the resonators for may be provided but are not shown in FIGS. 3A and 3B. The apparatus of FIGS. 3A and 3B also may be regarded as a composite resonator as it is formed from multiple integrated resonator components.

With the configurations of FIGS. 2, 3A and 3B, tight thermal and mechanical contact may be achieved between resonator pairs. That is, Resonators #1 and #2 of each pair are placed in close thermal proximity and, preferably in the nearest thermal proximity. By close thermal proximity, it is meant that the two resonators of each pair are positioned sufficiently close to one another so ambient thermal perturbations are substantially the same (such as temperature fluctuations from the environment and/or other sources), i.e. any ambient thermal perturbations are shared or are in common). As such, environmental variations in temperature affect the two resonators of each pair in substantially the same fashion and by substantially the same amount. Likewise, the two resonators #1 and #2 of each pair are placed in close mechanical proximity so that environmental vibrations or other mechanical perturbations or the like will affect the two resonators of each pair in substantially the same fashion and by substantially the same amount.

Note that the particular dimensions and spacing of the components to achieve sufficiently close thermal and/or mechanical proximity may depend on the particular choice of materials and on other factors and can be determined using otherwise conventional design and testing techniques to achieve a wanted, desired, or selected degree of spectral purity. Note also that the frequency of lasers providing input light beams follows the frequency of the resonators due to the mode locking.

Operational Principles

The quality of the RF signal depends on the quality of the light emitted by the lasers. The phase noise of the generated RF signal ($L_{RF}$) is related to the phase noise of the lasers demodulated at a fast photodiode $L_{laser}$ as $L_{RF}=2L_{laser}$. It is assumed here that worst case is when the lasers are not correlated. To generate a 110 GHz signal characterized with phase noise $L_{RF}$=−100 dBc/Hz at 11 kHz, the optical signal should have phase noise $L_{laser}$=−103 dBc/Hz at 11 kHz. Such a phase noise value is achievable in practice with table top-stabilized fiber lasers; however such a value may be unreachable with chip scale semiconductor distributed feedback (DFB) lasers. To achieve such a phase noise value, the DFB lasers should be tightly locked to the microresonator modes.

One aspect of the methods and apparatus disclosed herein is using tunable laser chip-scale systems based on semiconductor lasers that are locked to external optical microresonators made with an electro-optic material, e.g. stoichiometric lithium tantalate. The backscattered light returned to the diode facet forces the diode laser to injection lock to the resonator mode. (This process is the aforementioned "self-injection locking" but, as noted above, other forms of locking may be used.) Tuning of the resonator frequency, through electro-optic effect, tunes the laser wavelength. A locked laser generally has a narrower linewidth, larger side mode suppression, more rarified frequency and spatial mode spectra, and a wider tuning range than a bare diode laser. A significant aspect of the devices described herein is in the tunability, in at least some examples, over tens of GHz in sub-microsecond time. An additional reflector can be used to improve the locking performance.

Another aspect of the exemplary generators described herein is that their operational frequency can, fundamentally, reach W-band and higher without degradation of the spectral purity of the generated signal. This occurs because the equivalent RF quality factor of the generator loop does not degrade with the oscillation frequency. The phase noise of the generator thus will not (significantly) change through the entire operation band.

Exemplary Tuning Strategies and Methods

Figure 4:
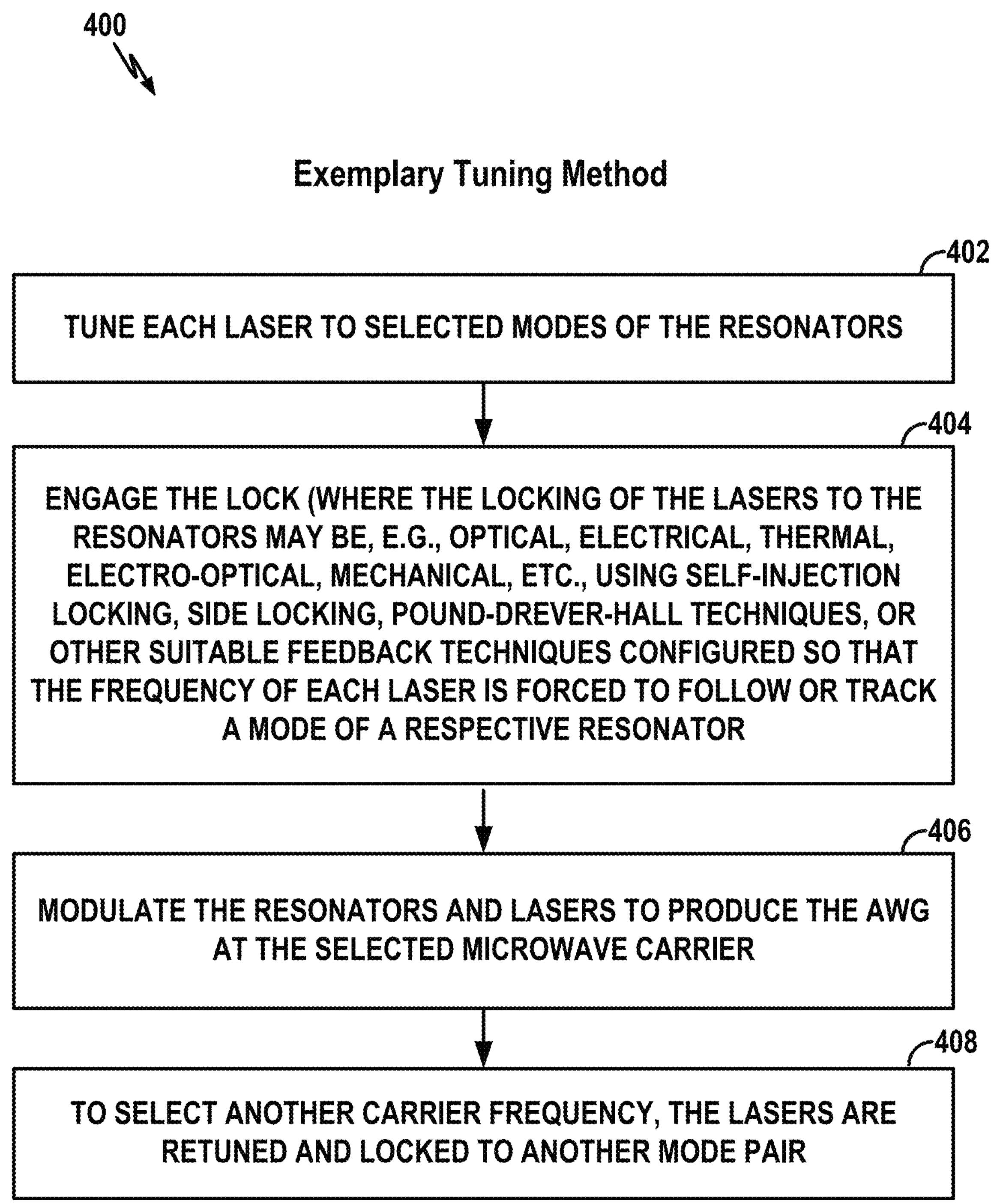
FIG. 4 illustrates an exemplary tuning method for tuning the AWG apparatus.

As shown in FIG. 4, an exemplary tuning method or strategy 300 for tuning the apparatus of FIG. 1 involves the following operations: each of the lasers is tuned to selected modes of the resonators (block 402); the locks are engaged (block 404), e.g. self-injection locking or some other form of locking of the lasers is achieved; the resonators and lasers are modulated to produce the AWG at the selected microwave carrier (block 406); and then, to select another carrier frequency, the lasers are retuned and locked to another mode pair (block 408). The tuning can be, for example, electrical, thermal, electro-optical and/or mechanical using suitable transducers. That is, at block 404, the locking of the lasers to the respective resonators may be, e.g., optical, electrical, thermal, mechanical, etc., and may use self-injection locking, side locking, Pound-Drever-Hall techniques, or other suitable feedback techniques configured so that the frequency of each laser is forced to follow or track a mode of a respective resonator.

Exemplary Electro-Optic Tuning Ranges

The maximum frequency shift of the transverse electric (TE) and transverse magnetic (TM) mode when direct current (DC) voltage is applied to a resonator made out of lithium niobate or lithium tantalate can be found from:

$$\Delta\nu_{TE} = \nu_0\frac{n_e^2}{2}r_{33}R_Z \text{ and } \Delta\nu_{TM} = \nu_0\frac{n_0^2}{2}r_{13}E_Z$$

where $v_0=2\times10^{14}$ Hz is the carrier frequency of the laser, r33=31 μm/V and r33=10 μm/V are the electro-optic constants of congruent lithium niobate, $n_o$=2.28 and $n_e$=2.2 are the refractive indexes of congruent lithium niobate. It is often better to work with the TE modes because their electro-optic shifts are three times as much as those of TM modes for the same values of the applied voltage. The electro-optic coefficients can be even higher for the stoichiometric materials.

The resultant frequency shift of TE modes corresponds to 0.3 GHz/V for a 50 μm thick resonator. It can require a magnitude of 300 V to achieve a 100 GHz frequency shift in the same resonator. While it is possible to apply such a voltage to the material, the high voltage might restrict the tuning speed. It is possible to reduce this requirement on the voltage magnitude at least twice if one fabricates a composite resonator as discussed above and reduces (limits) the thickness of the materials.

Exemplary Strain Tuning Ranges

Fast mechanical tuning is an alternative to electro-optical tuning of the resonator. An advantage of mechanical tuning is in its applicability to any (i.e. not necessarily electro-optic) resonator. Mechanical tuning allows usage of a very-high-Q resonator for microresonator locking. Theoretical analysis indicates that tunability of the resonator frequency can be realized via mechanical tuning. The range of fast mechanical tunability of the resonator can exceed 11 GHz per 110V. Using an opto-mechanical tuning of the oscillator frequency instead of electro-optical tuning should help avoid photorefractivity issues. Computer model simulations of an apparatus with lead zirconate titanate (PZT) bonded to a microresonator (provided to realize fast tuning of a photonic voltage controlled oscillator (VCO)) have shown that a tuning speed as fast as 1 GHz per ten microseconds is achievable. The tuning range approaches 11 GHz.

Voltage Source Considerations

Noise of a control voltage source can be imprinted on the noise of the generated microwave waveform. One of the best currently-available sources, Agilent B2961A with an optional filter, has 11 kHz operation noise 1 nV/rtHz. One can have ~10 GHz/100V tuning to realize the phase noise value of −100 dBc/Hz at 11 kHz frequency offset. The broader tuning may be done thermally or via retuning the lasers to different modes of the resonators as discussed above. The following equations and analysis may be helpful in understanding these noise considerations. VCO sensitivity is k [Hz/V]. A value of 1 GHz per 11V is assumed to begin with ($k=10^8$ Hz/V). RMS voltage noise of 1 nV/rtHz at 11 kHz is used.

RMS frequency noise may be represented by:

$$s_V(f)=1\ \text{nV}/\sqrt{\text{Hz}}$$

Power spectral density of fractional frequency fluctuations of the generated signal may be represented by:

$$S_y(f)=k^2 s_V^2(f)[\text{Hz}^2/\text{Hz}]$$

Power spectral density of phase noise may be represented by ($v_0$ is the carrier frequency of the generated signal):

$$S_y(f) = \frac{1}{v_o^2} k^2 S_V^2(f) [1/\text{Hz}]$$

Single side band (SSB) phase noise, L(f), may be calculated using the following reasoning:

$$S_y(f) = \frac{f^2}{v_o^2} S_\varphi(f)$$

$$S_\varphi(f) = \frac{v_0^2}{f^2} S_y(f) = \frac{k^2}{f^2} s_V^2(f)$$

$$L(f) = \frac{1}{2} S_\varphi(f) = \frac{1}{2} \frac{k^2}{f^2} s_V^2(f) = \frac{1}{2} \frac{(10^8)[\text{Hz}^2/V^2]}{(10^4)^2[\text{Hz}^2]} (10^{-9})^2 \left[\frac{V^2}{\text{Hz}}\right] = 5 \times 10^{-11} \frac{1}{\text{Hz}} \equiv -103\ dBc/\text{Hz}$$

Therefore, one should use a voltage source with RMS voltage noise 1 nV/rtHz at 11 kHz to create a VCO with frequency noise L(f)=−103 dBc/Hz and 110 MHz per 1V. Higher tuning sensitivity and/or higher voltage noise of the voltage source can result in increase of the noise. This conclusion is applicable to most any type of a VCO and an AWG.

Alternative Arrangements

Figures 5A, 5B:
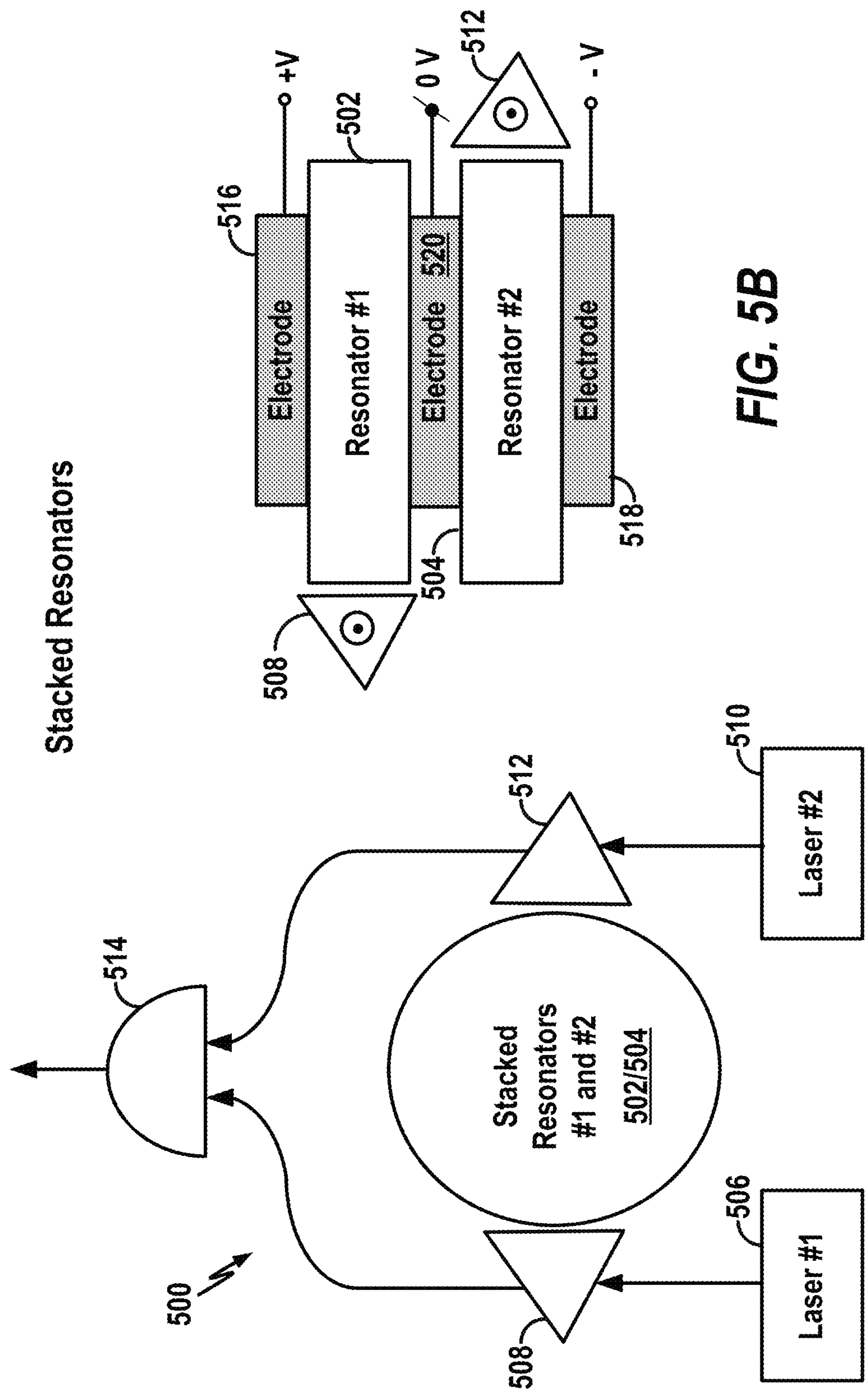
FIGS. 5A and 5B illustrate the resonator arrangement of FIG. 4 for an example where the monolithically-attached resonators are stacked.

FIGS. 5A and 5B illustrate another example of a resonator arrangement via schematic 500 with stacked resonators. (FIGS. 5A and 5B are similar to FIGS. 3A and 3B but illustrate some different and/or additional components.) As shown, stacked resonators #1 and #2 (labeled 502 and 504, respectively) are monolithically attached to each other to increase the thermal overlap. That is, the two resonators are mounted one atop the other with electrodes connected on opposing sides and in the middle. Laser #1 (denoted 506) is coupled via a first optical coupler 508 to resonator #1 and locked (using optical self-injection locking or other suitable locking technique). Laser #2 (denoted 510) is coupled via a second optical coupler 512 to resonator #2 and locked (using optical self-injection locking or other suitable locking technique). In the example, the first and second optical couplers 508 and 512 are prisms but other couplers may be used. A combiner 514 is used to combine the two output optical beams (routed via, e.g., fiber optic components, not shown) from the two resonators into a combined signal for routing to a fast photodiode (not shown) for use in generating an output RF signal (which then may be shaped into an arbitrary waveform, as already described). For tuning of the resonators, a positive voltage (+V) may be applied to a first (e.g. top) electrode 516, and a negative voltage (−V) may be applied to a second (e.g. bottom) electrode 518. The middle electrode 520 may have a zero voltage (0 V). Although not shown in FIGS. 5A and 5B, an electronic driver may be coupled to the lasers and to the electrodes of the resonator to control the tuning.

Figures 6A, 6B:
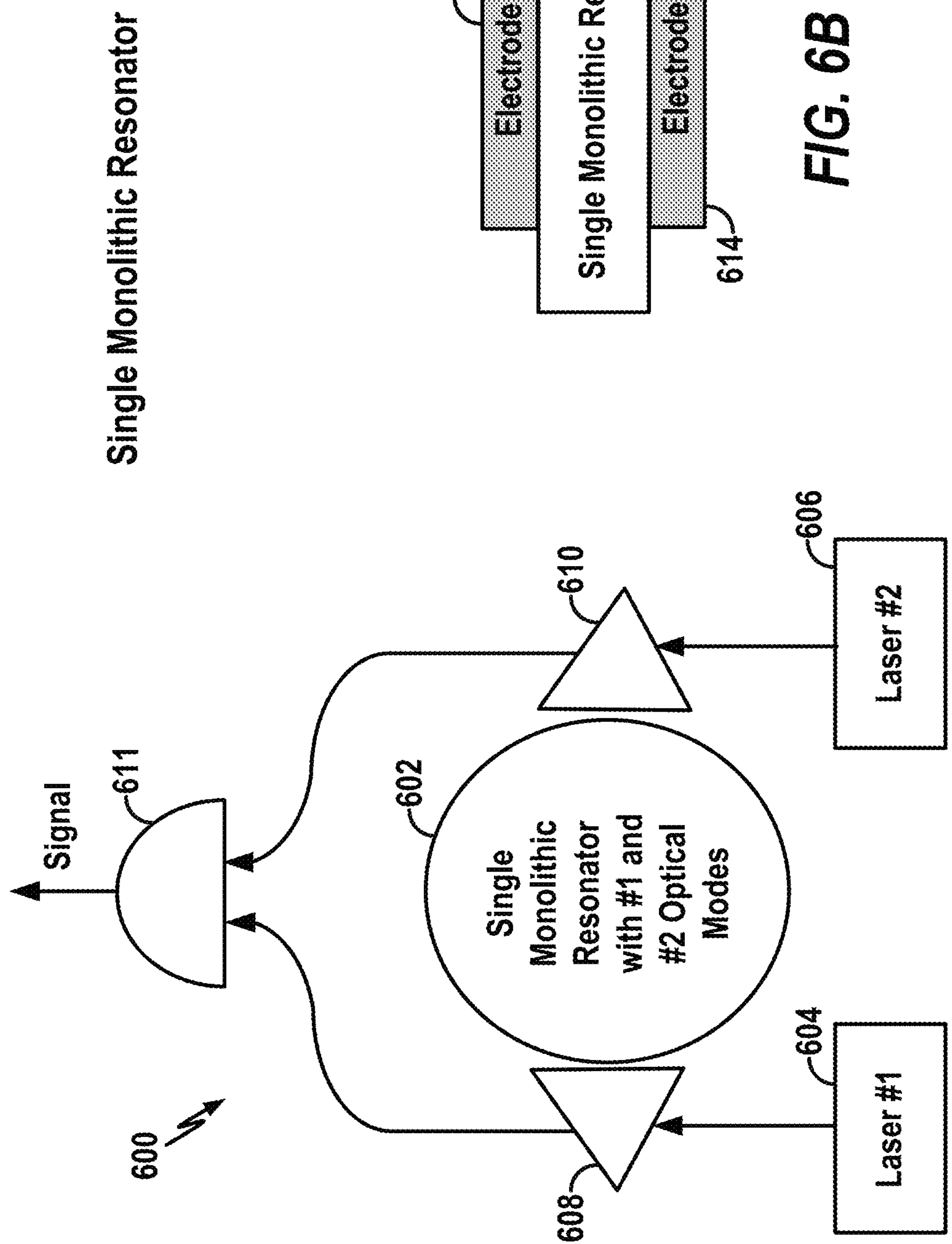
FIGS. 6A and 6B illustrate another exemplary resonator arrangement for the AWG apparatus, wherein a single monolithic resonator has at least two optical modes characterized by dissimilar voltage, thermal, or mechanical sensitivities, and two lasers are locked, respectively, to the two modes of the single monolithic resonator.

FIGS. 6A and 6B illustrate another alternative exemplary resonator arrangement via schematic 600. As shown, a single monolithic 602 resonator is coupled to laser #1 (denoted 604) and to laser #2 (denoted 606) using two couplers (denoted 608 and 610). In this example, the coupling is optical but, as noted, other forms of coupling may be employed. The single monolithic resonator 602 has at least two optical modes (Mode #1 and Mode #2) that are characterized with dissimilar voltage and/or thermal and/or mechanical sensitivity. Laser #1 is locked to Mode #1. Laser #2 is locked to Mode #2. A combiner 611 combines the two output optical beams from the resonator 602 (routed via, e.g., fiber optic components, not shown) into a combined signal for routing to a photodiode (not shown) for use in generating an output RF signal. Electrodes are mounted to opposing sides of the single monolithic resonator. For tuning of the resonator, a voltage (V) may be applied to the first (e.g. top) electrode 612, with the second (e.g. bottom) electrode 614 held at zero voltage (0 V). Although not shown in FIGS. 6A and 6B, an electronic driver may be coupled to the lasers and to the electrodes to control the tuning.

Figure 7:
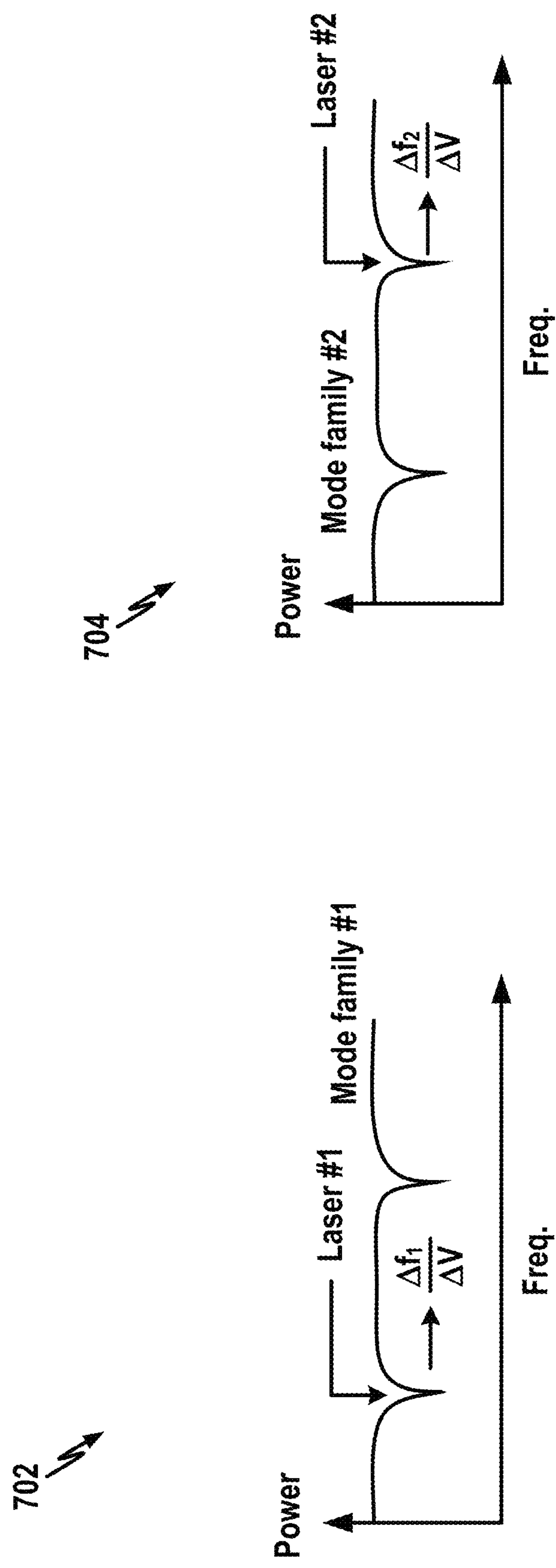
FIG. 7 includes graphs illustrating exemplary power vs. frequency curves for first and second mode families of the embodiment of FIG. 6

FIG. 7 provides graphs 702 and 704 of power vs. frequency for first and second mode families, which show that there are two different frequencies associated with the two lasers and mode families, characterized by $\Delta f_1/\Delta V$ and $\Delta f_2/\Delta V$, respectively.

Further Embodiments

Figure 8:
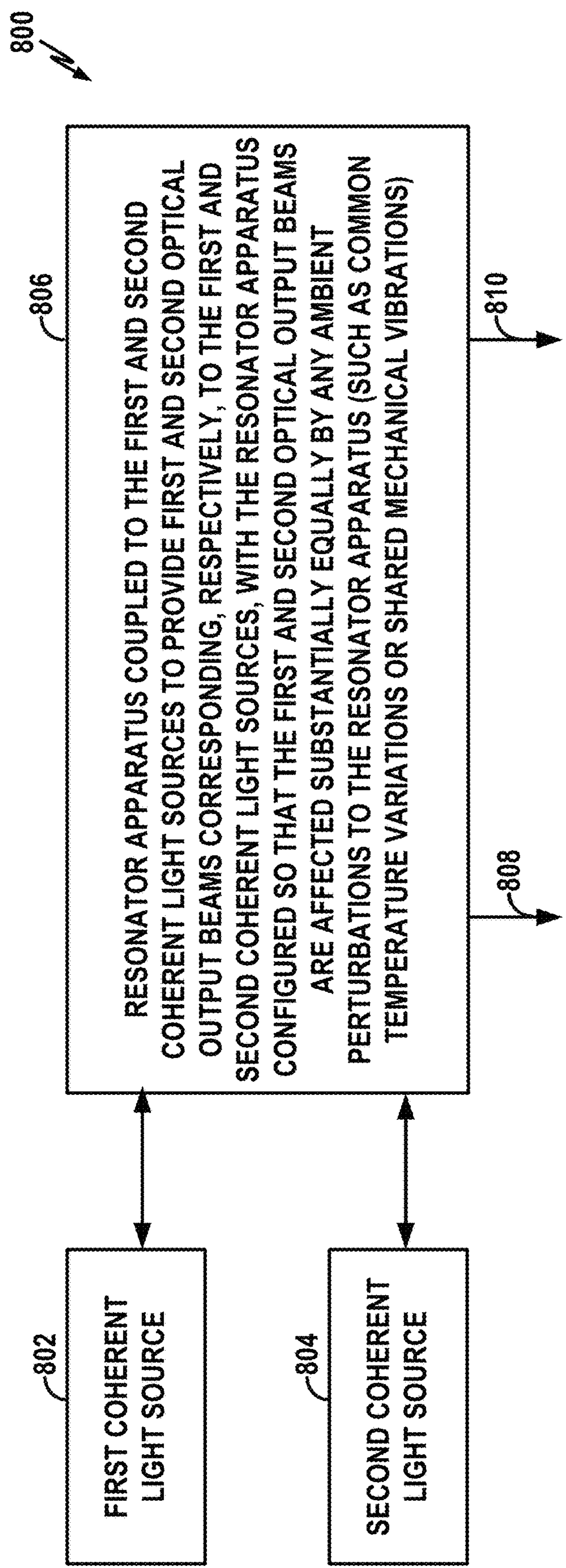
FIG. 8 is a block diagram summarizing an optical system that includes a resonator apparatus configured so that a pair of optical output beams are affected substantially equally by ambient perturbations to the resonator apparatus.

FIG. 8 summarizes features of an exemplary system or apparatus embodiment in accordance with an aspect of the disclosure. System or apparatus 800 includes first and second coherent light sources, 802 and 804, and a resonator apparatus 806. The resonator apparatus 806 is coupled to the first and second coherent light sources 802 and 804 to provide first and second optical output beams 808 and 810 that correspond, respectively, to the first and second coherent light sources 802 and 804. The resonator apparatus 806 is configured so that the first and second optical output beams 808 and 810 are affected substantially equally by any ambient perturbations to the resonator apparatus (such as common temperature variations or shared mechanical vibrations). Additionally, although not shown in FIG. 8, the apparatus may also include (a) an optical beam combiner configured to combine the first and second output beams into a combined optical beam and (b) an optical beam converter configured to convert the combined optical beam into an electrical output signal such as a microwave output signal. Illustrative examples of the various components of FIG. 8 are described above.

Figure 9:
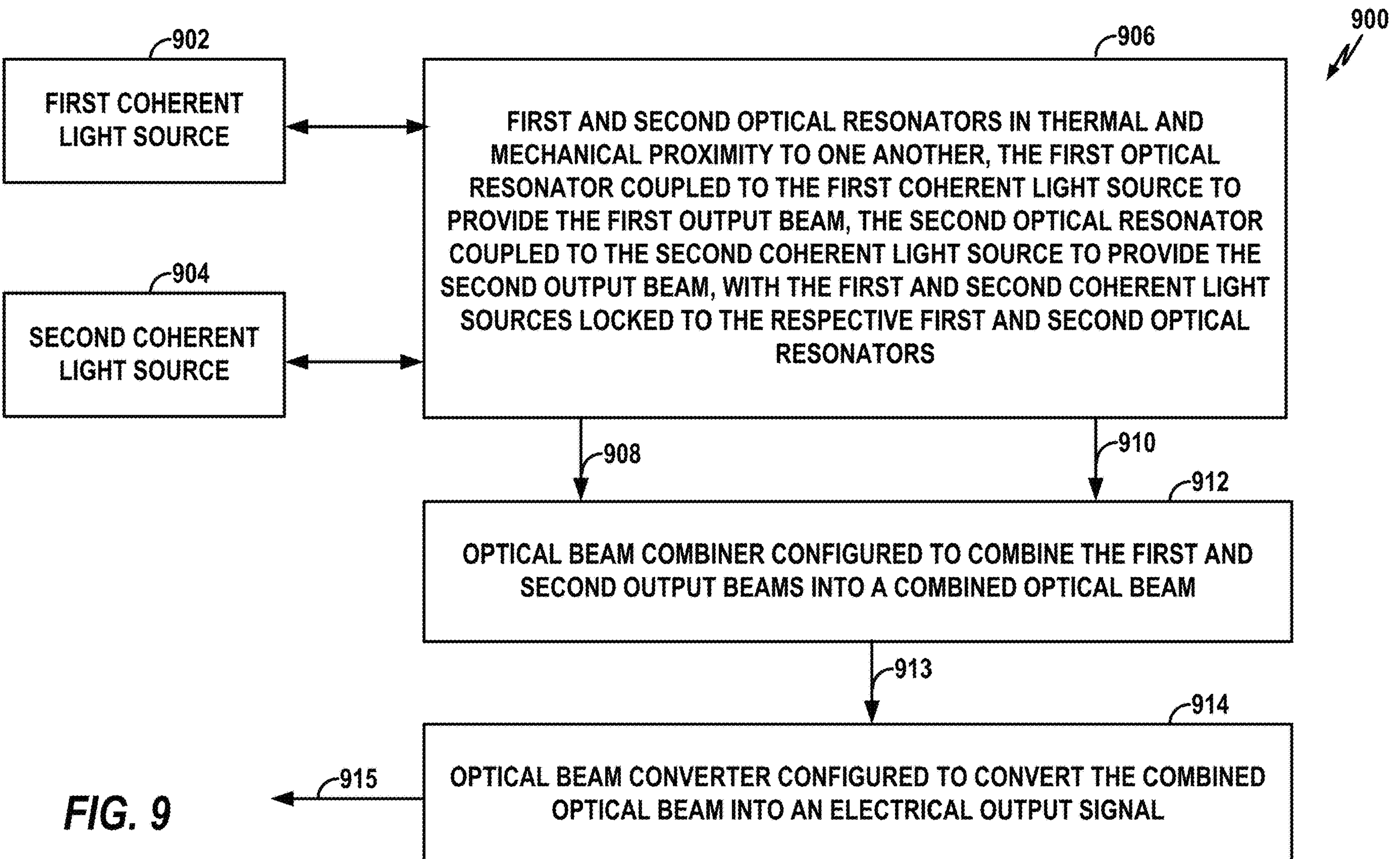
FIG. 9 is a block diagram summarizing an optical system that includes a resonator apparatus with a pair of optical resonators in thermal and mechanical proximity to one another so that a pair of optical output beams are affected substantially equally by ambient perturbations to the resonator apparatus.

FIG. 9 summarizes features of another exemplary system or apparatus embodiment in accordance with an aspect of the disclosure. As with the system or apparatus 800 of FIG. 8, the system or apparatus 900 of FIG. 9 includes first and second coherent light sources, 902 and 904, and a resonator apparatus 906. The resonator apparatus 906 is coupled to the first and second coherent light sources 902 and 904 to provide first and second optical output beams 908 and 910 that correspond, respectively, to the first and second coherent light sources 902 and 904. The resonator apparatus 906 is configured so that the first and second optical output beams 908 and 910 are affected substantially equally by any ambient perturbations to the resonator apparatus. The resonator apparatus 906 includes, in this example, first and second optical resonators (not shown separately in FIG. 9) in thermal and mechanical proximity to one another, with the first optical resonator coupled to the first coherent light source 902 to provide the first output beam 908, and the second optical resonator coupled to the second coherent light source 904 to provide the second output beam 910. The first and second coherent light sources 902 and 904 are locked to the respective first and second optical resonators of the resonator 906. The system or apparatus 900 also includes an optical beam combiner 912 configured to combine the first and second output beams 908 and 910 into a combined optical beam 913, and an optical beam converter 914 configured to convert the combined optical beam 913 into an electrical output signal 915. Illustrative examples of the various components of the system or apparatus 900 are described above.

Figure 10:
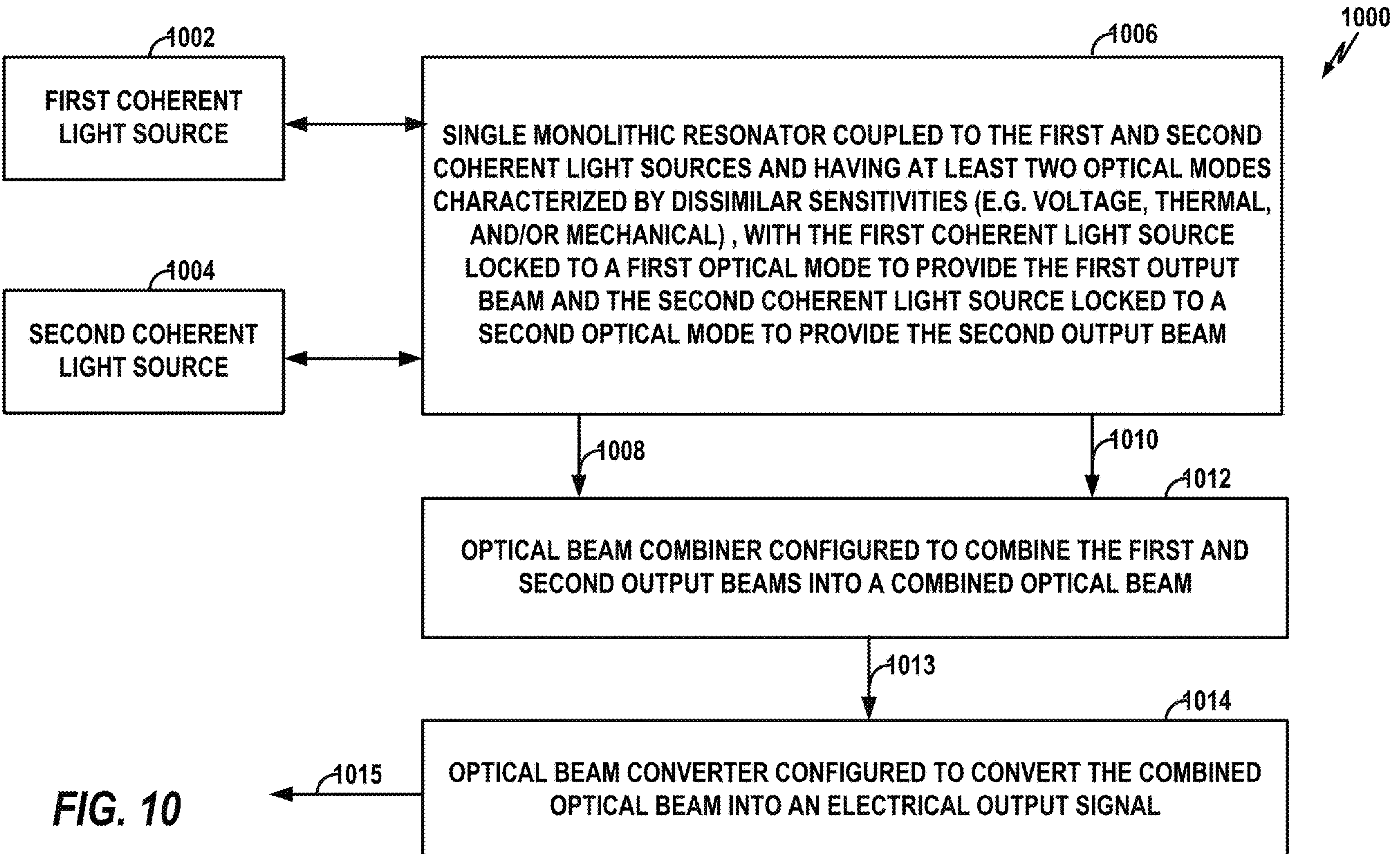
FIG. 10 is a block diagram summarizing an optical system that includes a resonator apparatus with a single monolithic resonator having at least two optical modes characterized by dissimilar voltage, thermal or mechanical sensitivities.

FIG. 10 summarizes features of another exemplary system or apparatus embodiment in accordance with an aspect of the disclosure. As with the systems or apparatus of FIGS. 8 and 9, the system or apparatus 1000 of FIG. 10 includes first and second coherent light sources, 1002 and 1004, and a resonator apparatus 1006. The resonator apparatus 1006 is coupled to the first and second coherent light sources 1002 and 1004 to provide first and second optical output beams 1008 and 1010 that correspond, respectively, to the first and second coherent light sources 1002 and 1004. The resonator apparatus 1006 is configured as a single monolithic resonator coupled to the first and second coherent light sources 1002 and 1004 and having at least two optical modes characterized by dissimilar sensitivities (e.g. voltage, mechanical and/or thermal sensitivity), with the first coherent light source 1002 locked to a first optical mode to provide the first output beam 1008 and the second coherent light source 1004 locked to a second optical mode to provide the second output beam 10010. The system or apparatus 1000 also includes an optical beam combiner 1012 configured to combine the first and second output beams 1008 and 1010 into a combined optical beam 1013, and an optical beam converter 1014 configured to convert the combined optical beam 1013 into an electrical output signal 1015. Illustrative examples of the various components of the system or apparatus 1000 are described above.

Figure 11:
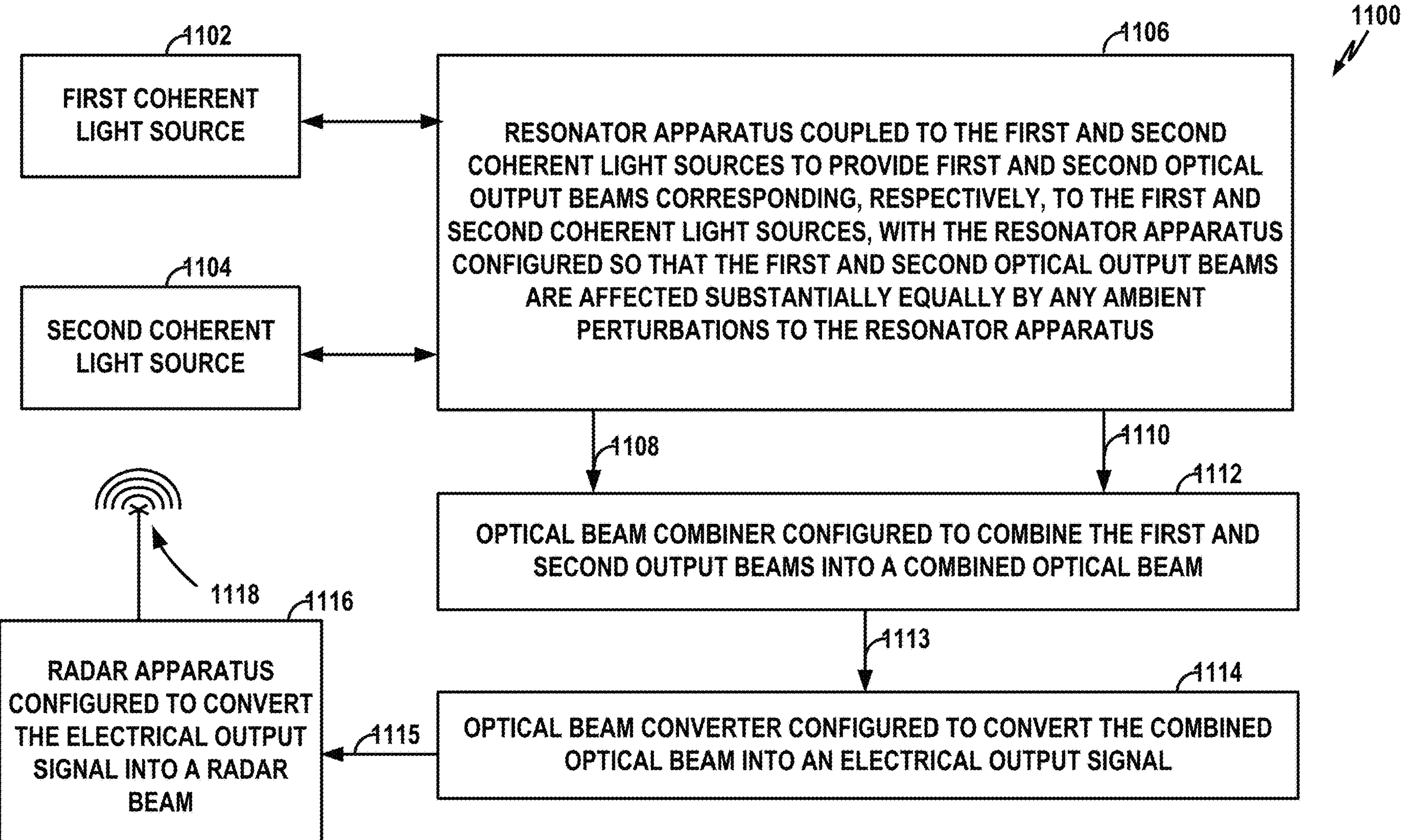
FIG. 11 is a block diagram summarizing a radar system that includes a resonator apparatus configured as in FIG. 8.

FIG. 11 summarizes features of another exemplary system or apparatus embodiment in accordance with an aspect of the disclosure. As with the systems or apparatus of FIGS. 8-10, the system or apparatus 1100 of FIG. 11 includes first and second coherent light sources, 1102 and 1104, and a resonator apparatus 1106. The resonator apparatus 1106 is coupled to the first and second coherent light sources 1102 and 1104 to provide first and second optical output beams 1108 and 1110 that correspond, respectively, to the first and second coherent light sources 1102 and 1104. The resonator apparatus 1106, in this example, is configured so that the first and second optical output beams 808 and 810 are affected substantially equally by any ambient perturbations to the resonator apparatus. The system or apparatus 1100 also includes an optical beam combiner 1112 configured to combine the first and second output beams 1108 and 1110 into a combined optical beam 1113, and an optical beam converter 1114 configured to convert the combined optical beam 1113 into an electrical output signal 1115. Still further, the system or apparatus 1100 includes a radar apparatus 1116 configured to convert the electrical output signal 1115 into a radar beam or radar signal for transmission via an antenna or antenna array 1118. The radar beam or radar signal may be in some examples a chirped frequency waveform, where the frequency chirp can be linear and/or nonlinear.

Figure 12:
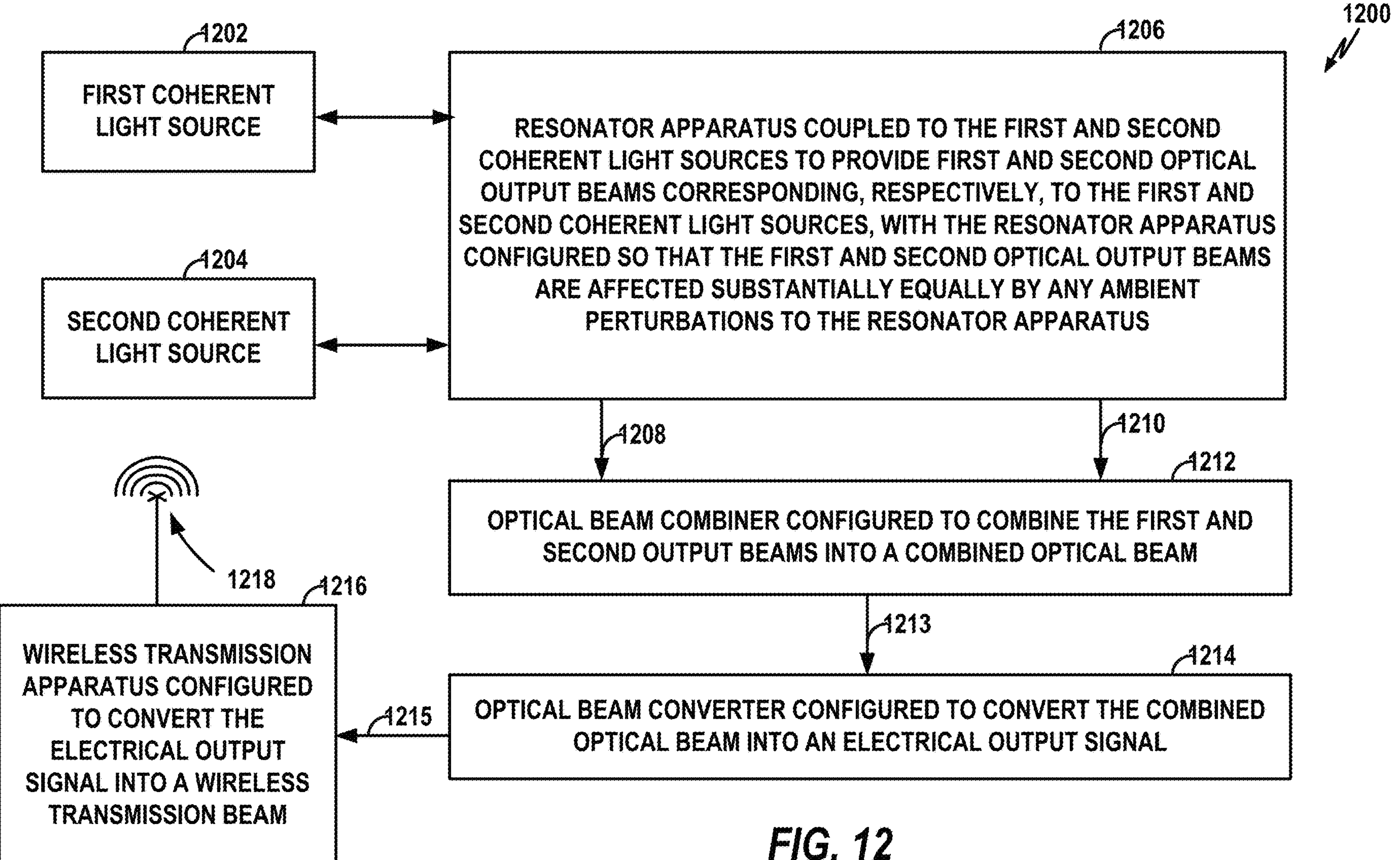
FIG. 12 is a block diagram summarizing a wireless transmission system that includes a resonator apparatus configured as in FIG. 8.

FIG. 12 summarizes features of another exemplary system or apparatus embodiment in accordance with an aspect of the disclosure. As with the systems or apparatus of FIGS. 8-11, the system or apparatus 1200 of FIG. 12 includes first and second coherent light sources, 1202 and 1204, and a resonator apparatus 1206. The resonator apparatus 1206 is coupled to the first and second coherent light sources 1202 and 1204 to provide first and second optical output beams 1208 and 1210 that correspond, respectively, to the first and second coherent light sources 1202 and 1204. The resonator apparatus 1206, in this example, is configured so that the first and second optical output beams 808 and 810 are affected substantially equally by any ambient perturbations to the resonator apparatus. The system or apparatus 1200 also includes an optical beam combiner 1212 configured to combine the first and second output beams 1208 and 1210 into a combined optical beam 1213, and an optical beam converter 1214 configured to convert the combined optical beam 1213 into an electrical output signal 1215. Still further, the system or apparatus 1200 includes a wireless transmission apparatus 1216 configured to convert the electrical output signal 1215 into a wireless signal for transmission via an antenna or antenna array 1218.

Figure 13:
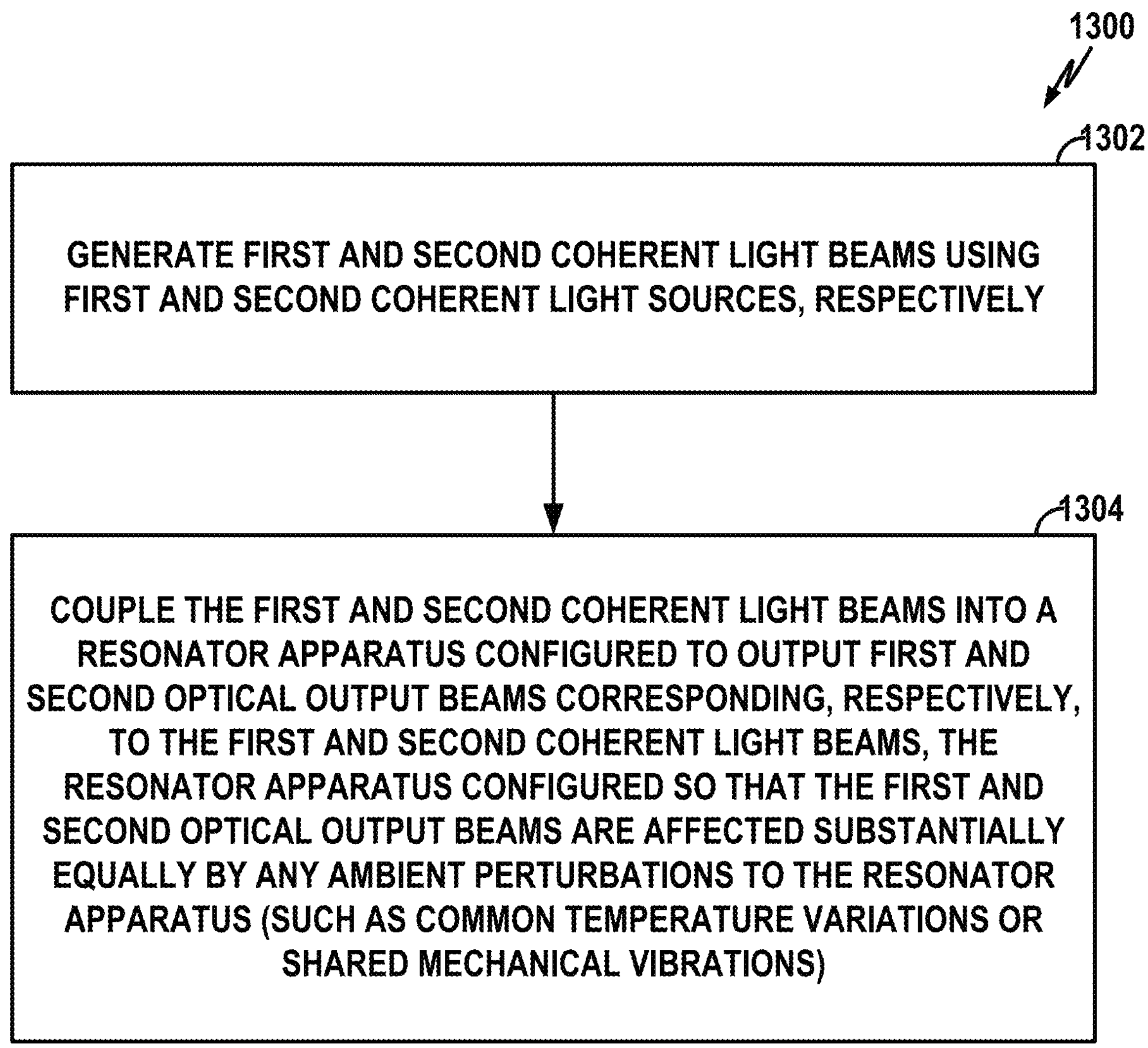
FIG. 13 is a flow diagram summarizing a method that uses a resonator apparatus configured so that a pair of optical output beams are affected substantially equally by ambient perturbations to the resonator apparatus.

FIG. 13 summarizes features of an exemplary method or procedure embodiment in accordance with an aspect of the disclosure. The method or procedure 1300 may be performed by suitable devices or apparatus described above such as the apparatus of FIG. 8. Briefly, at block 1302, the apparatus generates first and second coherent light beams using first and second coherent light sources, respectively. At block 1304, the apparatus couples the first and second coherent light beams into a resonator apparatus configured to output first and second optical output beams corresponding, respectively, to the first and second coherent light beams, the resonator apparatus configured so that the first and second optical output beams are affected substantially equally by any ambient perturbations to the resonator apparatus (such as common temperature variations or shared mechanical vibrations). Additionally, although not shown in FIG. 13, the apparatus may combine the first and second output beams into a combined optical beam and then convert the combined optical beam into an electrical output signal, such as a microwave signal, as already explained.

Figure 14:
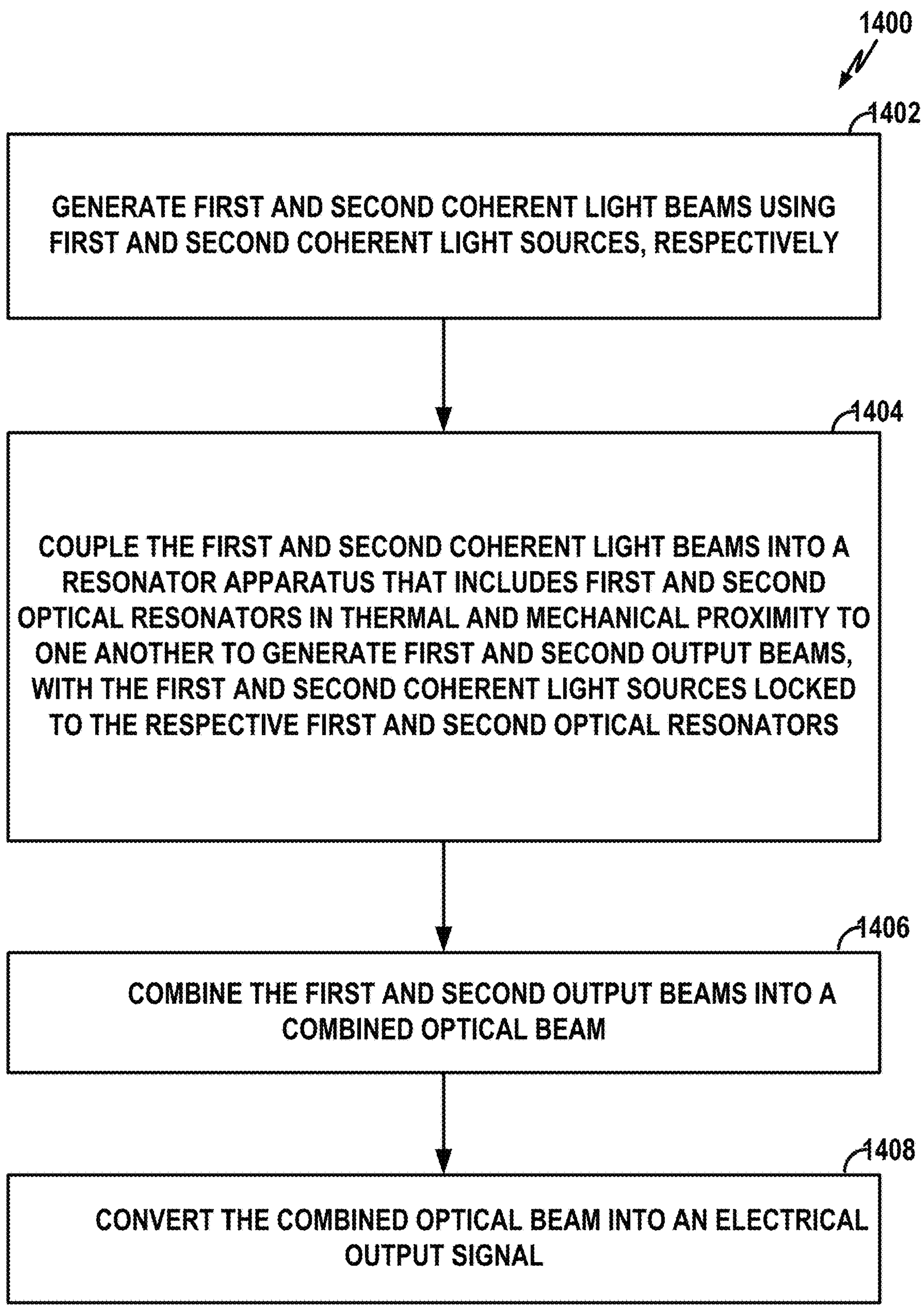
FIG. 14 is a flow diagram summarizing a method that uses a resonator apparatus configured with a pair of optical resonators in thermal and mechanical proximity to one another.

FIG. 14 summarizes features of another exemplary method or procedure embodiment in accordance with an aspect of the disclosure. The method or procedure 1400 may be performed by suitable devices or apparatus described above such as the apparatus of FIG. 9. Briefly, at block 1402, the apparatus generates first and second coherent light beams using first and second coherent light sources, respectively. At block 1404, the apparatus couples the first and second coherent light beams into a resonator apparatus that includes first and second optical resonators in thermal and mechanical proximity to one another to generate first and second output beams, with the first and second coherent light sources locked to the respective first and second optical resonators. At block 1406, the apparatus combines the first and second output beams into a combined optical beam and, at block 1408, the apparatus converts the combined optical beam into an electrical output signal. These operations may be performed in accordance with various examples described above.

Figure 15:
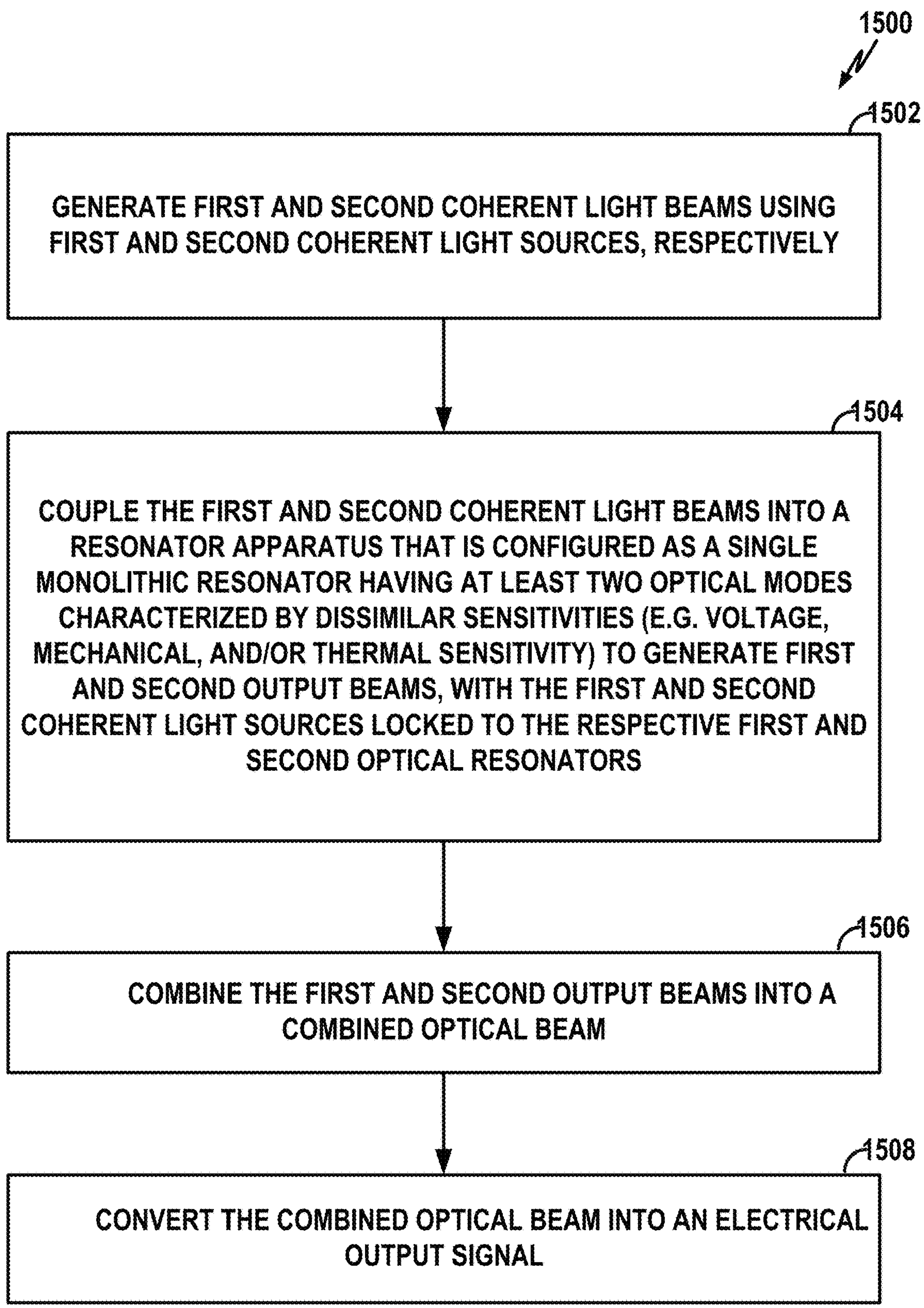
FIG. 15 is a flow diagram summarizing a method that uses a resonator apparatus configured as a single monolithic resonator having at least two optical modes characterized by dissimilar voltage, thermal, or mechanical sensitivities.

FIG. 15 summarizes features of another exemplary method or procedure embodiment in accordance with an aspect of the disclosure. The method or procedure 1500 may be performed by suitable devices or apparatus described above such as the apparatus of FIG. 10. Briefly, at block 1502, the apparatus generates first and second coherent light beams using first and second coherent light sources, respectively. At block 1504, the apparatus couples the first and second coherent light beams into a resonator apparatus that is configured as a single monolithic resonator having at least two optical modes characterized by dissimilar sensitivities (e.g. dissimilar voltage, mechanical, and/or thermal sensitivity) to generate first and second output beams, with the first and second coherent light sources locked to the respective first and second optical resonators. At block 1506, the apparatus combines the first and second output beams into a combined optical beam and, at block 1508, the apparatus converts the combined optical beam into an electrical output signal. These operations may be performed in accordance with various examples described above.

Figure 16:
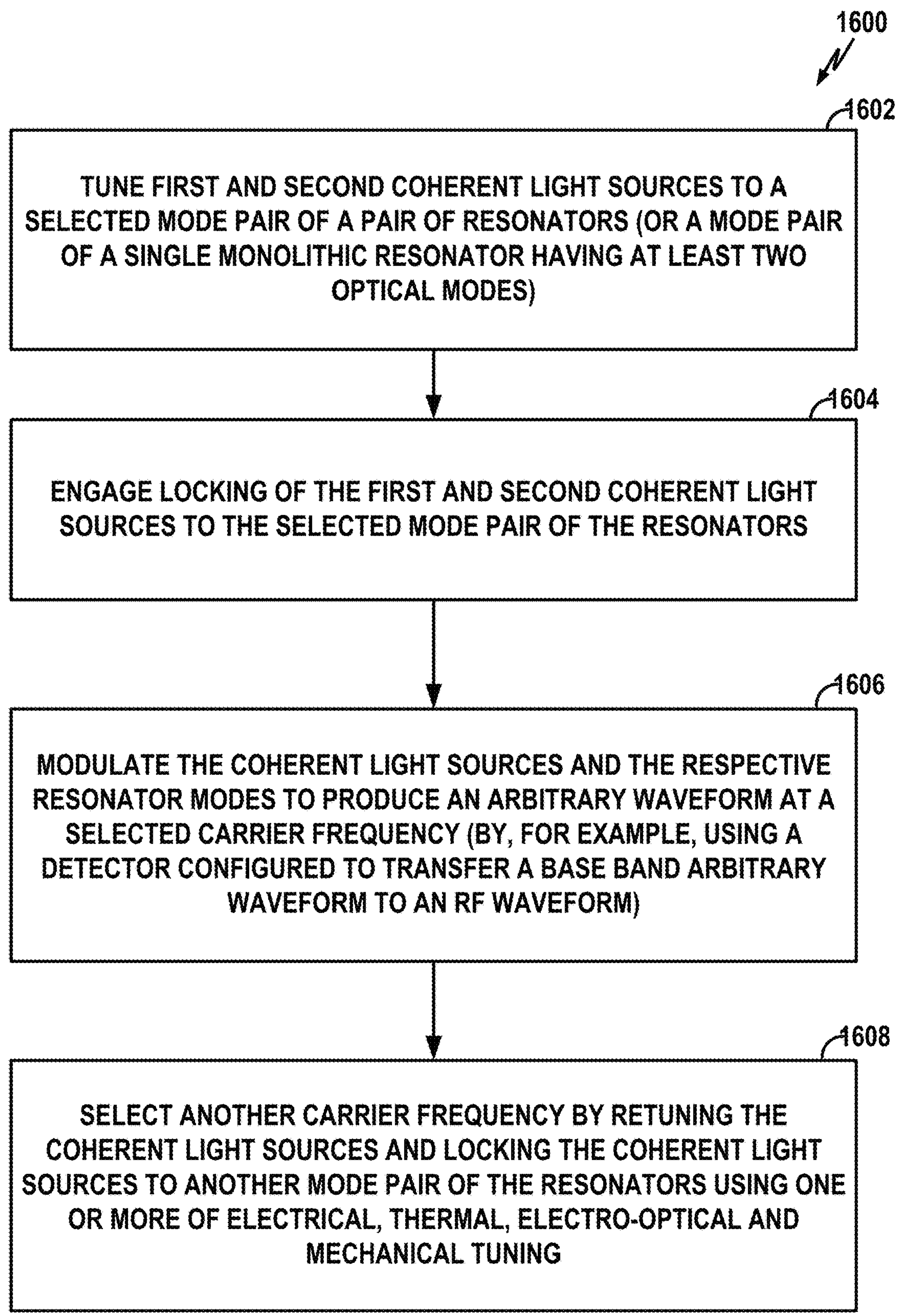
FIG. 16 is a flow diagram summarizing a tuning method for use with a resonator apparatus configured as single monolithic resonator.

FIG. 16 summarizes features of an exemplary tuning method or procedure embodiment in accordance with an aspect of the disclosure. The method or procedure 1600 may be performed by suitable devices or apparatus described above such as the apparatus of FIG. 1. Briefly, at block 1602, the apparatus tunes first and second coherent light sources to a selected mode pair of a pair of resonators (or a mode pair of a single monolithic resonator having at least two optical modes characterized, e.g., by dissimilar voltage, mechanical, and/or thermal sensitivity, as discussed above). At block 1604, the apparatus engages locking of the first and second coherent light sources to the selected mode pair. At block 1606, the apparatus modulates the coherent light sources and the respective resonator modes to produce an arbitrary waveform at a selected carrier frequency or wavelength (by, e.g., using a fast photodiode or other detector configured to transfer the base band arbitrary waveform to an RF waveform). At block 1608, the apparatus selects another carrier frequency or wavelength by retuning the coherent light sources and locking the coherent light sources to another mode pair using one or more of electrical, electro-optical, thermal, and/or mechanical tuning, etc.

Additional Aspects and Considerations

Note that one or more of the components, steps, features, and/or functions illustrated in FIGS. 1, 2, 3, 4, 5, 6, 7, 8, 9, 10, 11, 12, 13, 14, 15, and/or 16 may be rearranged and/or combined into a single component, step, feature or function or embodied in several components, steps, or functions. Additional elements, components, steps, and/or functions may also be added without departing from the invention.

In at least some examples, means may be provided for performing the functions illustrated in FIGS. 1-16 and/or other functions illustrated or described herein. For example, an apparatus may include one or more of: means, such as lasers 102 and 104 of FIG. 1, for generating first and second coherent light beams; means, such as couplers 110 and 112 of FIG. 1, for coupling the first and second coherent light beams into a resonator apparatus configured to output first and second optical output beams corresponding, respectively, to the first and second coherent light beams, the resonator apparatus configured so that the first and second optical output beams are affected substantially equally by any ambient perturbations to the resonator apparatus; and means, such as beam combiner 116 of FIG. 1, for combining the first and second output beams into a combined optical beam; and means, such as fast photodiode 118 of FIG. 1, for converting the combined optical beam into an electrical output signal.

The word "exemplary" is used herein to mean "serving as an example, instance, or illustration." Any implementation or aspect described herein as "exemplary" is not necessarily to be construed as preferred or advantageous over other aspects of the disclosure. Likewise, an aspect is an implementation or example. Reference in the specification to "an aspect," "one aspect," "some aspects," "various aspects," or "other aspects" means that a particular feature, structure, or characteristic described in connection with the aspects is included in at least some aspects, but not necessarily all aspects, of the present techniques. The various appearances of "an aspect," "one aspect," or "some aspects" are not necessarily all referring to the same aspects. Elements or aspects from an aspect can be combined with elements or aspects of another aspect.

The term "coupled" may mean that two or more elements are in direct physical or electrical contact. However, "coupled" may also mean that two or more elements are not in direct contact with each other, but yet still co-operate or interact with each other.

Not all components, features, structures, characteristics, etc. described and illustrated herein need be included in a particular aspect or aspects. If the specification states a component, feature, structure, or characteristic "may," "might," "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although some aspects have been described in reference to particular implementations, other implementations are possible. Additionally, the arrangement and/or order of elements or other features illustrated in the drawings and/or described herein need not be arranged in the particular way illustrated and described. Many other arrangements are possible according to some aspects.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus, comprising:

first and second coherent light sources;

a resonator apparatus coupled to the first and second coherent light sources to provide first and second optical output beams corresponding, respectively, to the first and second coherent light sources, wherein the resonator apparatus is configured so that the first and second optical output beams are affected substantially equally by any ambient perturbations to the resonator apparatus;

an optical combiner configured to combine the first and second optical output beams into a combined optical beam;

a converter configured to convert the combined optical beam into a microwave output signal; and a modulator configured to modulate one or more of the first and second coherent light sources, the resonator apparatus, the optical combiner, and the converter to produce an arbitrary microwave waveform as the microwave output signal.

2. The apparatus of claim 1, wherein the resonator apparatus comprises:

first and second optical resonators in thermal and mechanical proximity to one another, the first optical resonator coupled to the first coherent light source to provide the first output beam, the second optical resonator coupled to the second coherent light source to provide the second output beam, with the first and second coherent light sources locked to the respective first and second optical resonators.

3. The apparatus of claim 2, wherein the first and second optical resonators are stacked in close thermal and mechanical proximity as a composite resonator.

4. The apparatus of claim 2, wherein the first and second optical resonators and the first and second coherent light sources are independently-tunable using one or more drivers to achieve selected output beam amplitudes and frequencies.

5. The apparatus of claim 2, wherein the first and second optical resonators are formed from a material selected to enable agile frequency tuning of their spectra.

6. The apparatus of claim 2, wherein the first and second optical resonators are mounted side-by-side in close thermal and mechanical proximity on a common thermally-conductive substrate.

7. The apparatus of claim 1, wherein the resonator apparatus comprises:

a single monolithic resonator coupled to the first and second coherent light sources and having at least two optical modes characterized by dissimilar sensitivities, with the first coherent light source locked to a first optical mode to provide the first output beam and the second coherent light source locked to a second optical mode to provide the second output beam.

8. The apparatus of claim 1, wherein the first and second coherent light sources are independently-tunable semiconductor lasers.

9. The apparatus of claim 1, wherein the optical beam converter comprises:

a detector configured to convert the combined optical beam into a microwave electrical signal;

a microwave amplifier configured to amplify the microwave electrical signal; and a dispersive element configured to shape the microwave electrical signal into an output signal having a selected shape.

10. The apparatus of claim 1, wherein the modulator comprises an electric waveform generator configured to apply control signals to the first and second coherent light sources to generate selected optical waveforms.

11. The apparatus of claim 1, further comprising a radar apparatus configured to convert the output signal into a radar beam.

12. The apparatus of claim 1, further comprising a wireless transmission apparatus configured to convert the output signal into a wireless transmission beam.

13. A method, comprising:

generating first and second coherent light beams using first and second coherent light sources, respectively;

coupling the first and second coherent light beams into a resonator apparatus configured to output first and second optical output beams corresponding, respectively, to the first and second coherent light beams, the resonator apparatus configured so that the first and second optical output beams are affected substantially equally by any ambient perturbations to the resonator apparatus;

combining the first and second optical output beams into a combined optical beam using an optical combiner;

converting the combined optical beam into a microwave output signal using a converter; and modulating one or more of the first and second coherent light sources, the resonator apparatus, the optical combiner, and the converter to produce an arbitrary microwave waveform as the microwave output signal.

14. The method of claim 13, wherein the resonator apparatus includes first and second optical resonators in thermal and mechanical proximity to one another, and wherein the method further comprises:

coupling the first and second coherent light beams into the first and second optical resonators, respectively, to generate the first and second output beams, with the first and second coherent light sources locked to the respective first and second optical resonators.

15. The method of claim 13, wherein the resonator apparatus is configured as a single monolithic resonator having at least two optical modes characterized by dissimilar sensitivities, and wherein the method further comprises:

coupling the first and second coherent light beams into the first and second optical modes, respectively, of the monolithic resonator to generate the first and second output beams, with the first and second coherent light sources locked to the respective first and second optical modes.

16. The method of claim 15, further comprising:

tuning the first and second coherent light sources to a selected mode pair of the resonators;

engaging locking of the first and second coherent light sources to the selected mode pair of the resonators;

modulating the coherent light sources and the respective resonator modes to produce the arbitrary microwave waveform at a selected microwave carrier; and selecting another carrier frequency by retuning the coherent light sources and locking the coherent light sources to another mode pair of the resonators using one or more of electrical, electro-optical, thermal, and mechanical tuning.

17. The method of claim 13, further comprising converting the combined optical beam into the microwave output signal by:

applying the combined optical beam to a detector configured to convert the combined optical beam into a microwave electrical signal;

amplifying the microwave electrical signal using a microwave amplifier; and shaping the microwave electrical signal into the microwave output signal having a selected shape using a dispersive element.

18. An apparatus, comprising:

means for generating first and second coherent light beams;

means for coupling the first and second coherent light beams into a resonator apparatus configured to output first and second optical output beams corresponding, respectively, to the first and second coherent light beams, the resonator apparatus configured so that the first and second optical output beams are affected substantially equally by any ambient perturbations to the resonator apparatus;

means for combining the first and second optical output beams into a combined optical beam;

means for converting the combined optical beam into a microwave output signal; and means for modulating one or more of the means for generating the first and second coherent light beams, the resonator apparatus, the means for combining, and the means for converting to produce an arbitrary microwave waveform as the microwave output signal.

19. An apparatus, comprising:

first and second coherent light sources;

a resonator apparatus coupled to the first and second coherent light sources to provide first and second optical output beams corresponding, respectively, to the first and second coherent light sources, wherein the resonator apparatus is configured so that the first and second optical output beams are affected substantially equally by any ambient perturbations to the resonator apparatus;

wherein the resonator apparatus comprises:

a single monolithic resonator coupled to the first and second coherent light sources and having at least two optical modes characterized by dissimilar sensitivities, with the first coherent light source locked to a first optical mode to provide the first output beam and the second coherent light source locked to a second optical mode to provide the second output beam.

* * * * *